United States Patent
Nakajima (10) Patent No.: US 6,356,008 B1
(45) Date of Patent: Mar. 12, 2002

(54) METHOD OF POLARIZING PIEZOELECTRIC BODY

(75) Inventor: Mikio Nakajima, Toyama-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/627,771

(22) Filed: Jul. 28, 2000

(30) Foreign Application Priority Data

Aug. 3, 1999 (JP) ............................................ 11-219425
Feb. 29, 2000 (JP) ............................................ 12-052743

(51) Int. Cl.⁷ .............................................. H01L 41/04
(52) U.S. Cl. ........................ 310/359; 310/357; 29/25.35
(58) Field of Search ................................. 310/357, 359; 29/25.35

(56) References Cited

U.S. PATENT DOCUMENTS

| | | | | |
|---|---|---|---|---|
| 4,564,782 A | * | 1/1986 | Ogawa ........................ 310/359 |
| 4,625,137 A | * | 11/1986 | Tomono ...................... 310/317 |
| 5,241,236 A | * | 8/1993 | Sasaki et al. ................ 310/358 |
| 5,350,964 A | * | 9/1994 | Hara et al. .................. 310/357 |
| 5,466,985 A | * | 11/1995 | Suzuki ........................ 310/333 |
| 5,475,278 A | * | 12/1995 | Inagawa et al. ............ 310/317 |
| 5,543,106 A | * | 8/1996 | Nakashima .................. 264/430 |
| 5,923,352 A | * | 7/1999 | Kikuchi et al. .............. 347/70 |
| 6,046,526 A | * | 4/2000 | Maruyama ............. 310/323.06 |
| 6,232,132 B1 | * | 5/2001 | Yano et al. ..................... 438/3 |
| 6,265,811 B1 | * | 7/2001 | Takeuchi et al. ............ 310/330 |

FOREIGN PATENT DOCUMENTS

| | | | |
|---|---|---|---|
| JP | 04-273186 | * | 9/1992 |
| JP | 05-160462 | * | 6/1993 |
| JP | 09-102722 | * | 4/1997 |
| JP | 09-266332 | * | 10/1997 |
| JP | 10-4330 | | 1/1998 |

* cited by examiner

Primary Examiner—Nestor Ramirez
Assistant Examiner—Peter Medley
(74) Attorney, Agent, or Firm—Keating & Bennett, LLP (57) ABSTRACT

A method of polarizing a piezoelectric body having a plurality of piezoelectric layers and internal electrodes which are alternately laminated, includes the steps of applying an electric field to the piezoelectric body to polarize the body uniformly in the thickness direction, applying electric field in the opposite directions to the piezoelectric layers on both sides of each internal electrode whereby the piezoelectric layer only on one side of the internal electrode is polarization-inverted. The polarization degree polarization is made uniform by the polarization-inversion.

20 Claims, 5 Drawing Sheets

POLARIZATION
DEGREE

FIG. 3

INITIAL POLARIZATION

POLARIZATION INVERSION

METHOD OF POLARIZING PIEZOELECTRIC BODY

BACKGROUND OF THE INVENTION

1. Field of the Invention

The present invention relates to a method of polarizing a piezoelectric body, and more particularly, to a method of polarizing a piezoelectric body having a structure in which a plurality of piezoelectric layers and internal electrodes are alternately laminated, wherein the piezoelectric layers on both sides of each internal electrode are polarized in opposite directions.

2. Description of the Related Art

Conventionally, a piezoelectric resonator has been provided in which design flexibility of characteristics is substantial, a spurious response is small, and the difference Δf between the resonance and anti-resonance frequencies can be increased (Japanese Unexamined Patent Application Publication No. 10-4330). The piezoelectric resonator includes a plurality of piezoelectric layers and internal electrodes which are alternately laminated, and the piezoelectric layers on both sides of each internal electrode are polarized in opposite directions. For piezoelectric resonators having such a structure, the polarization degrees of the piezoelectric layers have a substantial effect on the characteristics of the resonator. Therefore, the amounts of scatter in polarization degrees within each device and between devices must be minimized as much as possible.

Figure 1:
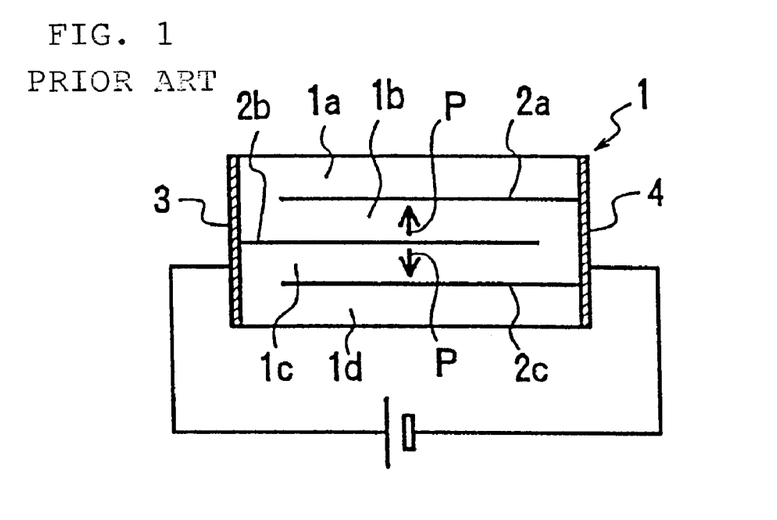
FIG. 1 illustrates a conventional method of polarizing a piezoelectric body.

The polarization treatment of this type of monolithic piezoelectric bodies is carried out as shown in FIG. 1. A piezoelectric body 1 is a block-shaped piezoelectric ceramic. Here, the piezoelectric body 1 composed of four piezoelectric layers 1a to 1d is shown for explanation, and may include at least five layers. Internal electrodes 2a to 2c are provided between the piezoelectric layers 1a to 1d, respectively. The internal electrodes 2a to 2c are led out alternately to the outer surfaces of the piezoelectric body 1 and connected to external electrodes 3 and 4, respectively. By applying a direct current electric field between the external electrodes 3 and 4, the piezoelectric layers 1b and 1c on both sides of the internal electrode 2b are polarized in opposite directions, respectively, as indicated by the arrows P to obtain a predetermined polarization degree.

Figure 2:
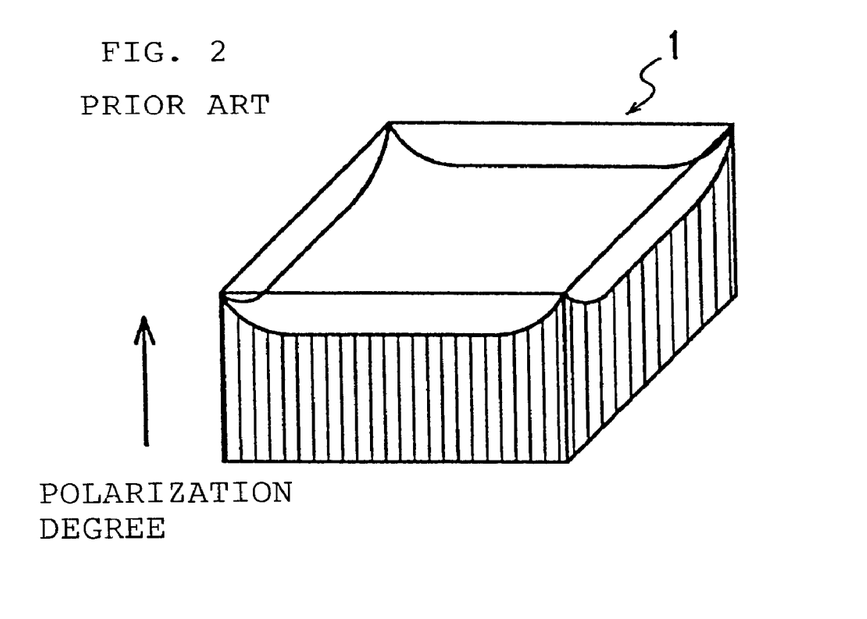
FIG. 2 is a perspective view showing the polarization degree distribution of the piezoelectric body polarized according to the method of FIG. 1.

However, according to the method shown in FIG. 1, the electric field is concentrated at the end portions of the internal electrodes 2a to 2c, which causes the polarization degree distribution to be non-uniform. FIG. 2 shows an example of the polarization degree distribution, in which the slanted lines represent the polarization degrees. As seen in FIGS. 1 and 2, when the electric fields are applied to the piezoelectric body 1 in the thickness direction, the polarization degree is substantially increased in the four corners of the piezoelectric body 1. Thus, a uniform polarization degree distribution cannot be obtained. As a result, if the piezoelectric body having such a non-uniform polarization degree distribution is cut in substantially rectangular elements for use as completed devices, the peripheral portions of the piezoelectric body cannot be used. That is, the use range (yield of the piezoelectric body) is substantially limited.

SUMMARY OF THE INVENTION

To overcome the problems described above, preferred embodiments of the present invention provide a method of polarizing a piezoelectric body in which the polarization degree distribution of a monolithic piezoelectric body produced by the method is substantially uniform, and the yield is, therefore, greatly improved.

According to a first preferred embodiment of the present invention, a method of polarizing a piezoelectric body having a plurality of piezoelectric layers and internal electrodes which are alternately laminated, includes the steps of applying an electric field to the piezoelectric body to polarize the body uniformly in the thickness direction thereof, and applying electric fields in the opposite directions to the piezoelectric layers on both sides of each internal electrode, respectively, whereby only the piezoelectric layer on one side of the internal electrode is polarization-inverted.

According to a preferred embodiment of the present invention, a method of polarizing a piezoelectric body having a plurality of piezoelectric layers and internal electrodes are alternately laminated includes the steps of applying a first electric field to the piezoelectric body to polarize the body uniformly in the thickness direction thereof, applying a second electric field in the reverse direction with respect to the direction of the first electric field, whereby the piezoelectric body is polarization-inverted uniformly in the thickness direction, and applying electric fields in the opposite directions to the piezoelectric layers on both sides of each internal electrode, respectively, whereby only the piezoelectric layer on one side of the internal electrode is polarization- inverted.

Further, according to a third preferred embodiment of the present invention, a method of polarizing a piezoelectric body having a plurality of piezoelectric layers and internal electrodes which are alternately laminated, includes the steps of applying electric fields in the opposite directions to the piezoelectric layers on both sides of each internal electrode, respectively, whereby the piezoelectric layers on both sides of the internal electrode are polarized in the opposite directions, and applying electric fields in the reverse directions with respect to the directions of the above electric fields to the piezoelectric layers on both sides of the internal electrode, respectively, whereby the piezoelectric layers on both sides of the internal electrode are polarization-inverted.

According to the first preferred embodiment of the present invention, after an electric field is applied to the piezoelectric electric body to polarize the body uniformly in the thickness direction, electric fields are applied in the opposite directions to the piezoelectric layers on both sides of each internal electrode, respectively, whereby the piezoelectric layer only on one side of the internal electrode is polarization-inverted. By polarization-inverting the piezoelectric body, the phenomenon in which the polarization degree is increased in the four corners of the piezoelectric body is substantially suppressed, and the non-uniformity of the initial polarization degree distribution is substantially reduced. Therefore, when the substantially rectangular elements produced by cutting the piezoelectric body are used, the available range is significantly widened and the yield is greatly enhanced.

Figure 3:
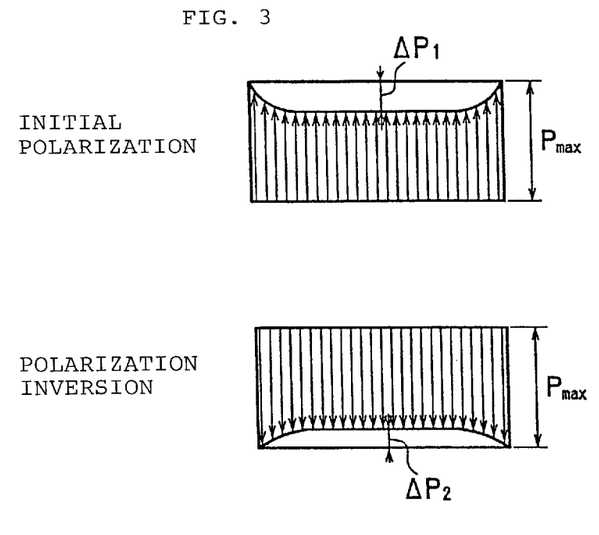
FIG. 3 illustrates the polarization degree distributions at initial polarization and polarization-inversion.

FIG. 3 illustrates the change of a polarization degree distribution, caused by initial polarization and polarization-inversion.

By the initial polarization, the polarization degrees increase in the end portions of the piezoelectric body with a large difference $\Delta P_1$ between the polarization degrees in the end portions and the approximate center portion. Subsequently, the polarization-inversion is carried out, so that the polarization axial direction is inverted, and simultaneously, the difference $\Delta P_2$ between the end portions and the approximate center portion is reduced. The electric field intensity at the polarization-inversion is substantially equal to that at the initial polarization, and the polarization time is shorter than that of the initial polarization. The maximum polarization degrees $P_{max}$ at the initial polarization and the polarization-inversion are equal to each other.

Figure 4:
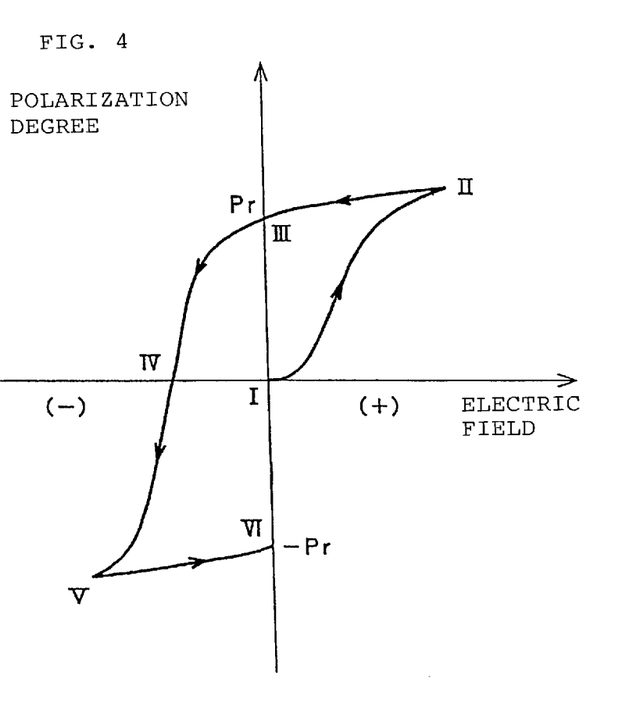
FIG. 4 illustrates the variation of a polarization degree caused when positive and negative electric fields are applied.

FIG. 4 shows the variation of a polarization degree when positive and negative electric fields are applied to a piezoelectric body.

First, when a positive electric field is applied at point I, the polarization degree is increased to point II. When the application of the electric field is stopped, the polarization degree is stabilized at point III. The polarization degree at the point III is a residual polarization degree. Subsequently, when an electric field is applied in the negative direction, the polarization degree is decreased to substantially zero (point IV). After this, the polarization axis is inverted, and the polarization degree is lowered to point V. When the application of the electric field is stopped, the polarization degree is restored to point VI where the polarization degree is stabilized.

In FIG. 4, the polarization degree Pr obtained after the positive electric field is applied and the polarization Pr obtained after the negative electric field is applied so that the piezoelectric body is polarization-inverted, are opposite in polarization axial direction, and are substantially equal to each other (points III and VI), if the electric field intensities are substantially the same except for the polarities. In addition, the amount of scatter in polarization degree distribution is greatly reduced as shown in FIG. 3.

In the first preferred embodiment of the present invention, the piezoelectric body is polarized uniformly in the thickness direction, and thereafter, the piezoelectric layer on one side of each internal electrode is polarization-inverted. In the second preferred embodiment of the present invention, the piezoelectric body is polarized uniformly in the thickness direction, and is polarization-inverted at the same time. Thereafter, the piezoelectric layer on one side of the internal electrode is polarization-inverted again, whereby the non-uniformity of the polarization degree distribution is substantially reduced. Further, the second polarization-inversion to be carried out is easily performed.

The step of polarizing (or polarization-inverting) the piezoelectric body uniformly in the thickness direction is carried out on the piezoelectric body in the block state according to the first and second preferred embodiments of the present invention. This is desirable to achieve greatly increased productivity. The succeeding polarization-inversion of the piezoelectric layer only on one side of each internal electrode is carried out on the piezoelectric body in the block state or on the substantially rectangular elements produced by cutting the piezoelectric body. Especially, in the case where the substantially rectangular elements produced by cutting the piezoelectric body are polarization-inverted, the intensity of electric field and the application time is set corresponding to the polarization degree distributions of the respective substantially rectangular elements. Accordingly, adjustment of the polarization degree can be performed with increased precision.

According to the third preferred embodiment of the present invention, electric fields are applied in opposite directions to the piezoelectric layers on both sides of each internal electrode, whereby the piezoelectric layers on both sides of the internal electrode are polarized in opposite directions. Further, electric fields are applied in the reverse directions with respect to the directions of the above electric fields to the piezoelectric layers on both sides of the internal electrode, whereby the piezoelectric layers on both sides of the internal electrode are polarization-inverted. That is, the polarization axial directions of the piezoelectric layers on both sides of the internal electrode are inverted with respect to the first polarization axial direction of the piezoelectric layers. For this reason, any of the piezoelectric layers is polarization-inverted, so that the amount of scatter of the polarization degree is effectively reduced.

Preferably, the polarization process is carried out on the piezoelectric body in the block state, and an electric field in the forward or backward direction is applied to each substantially rectangular element after the piezoelectric body is cut into the substantially rectangular elements. Accordingly, the polarization degree is individually adjusted to be increased or decreased. By this, the amounts of scatter in polarization degrees within each substantially rectangular elements and between the substantially rectangular elements are even more reduced.

Other features, characteristics, elements and advantages of the present invention will become apparent from the following description of preferred embodiments thereof with reference to the attached drawings.

DETAILED DESCRIPTION OF PREFERRED EMBODIMENTS

Figure 5A:
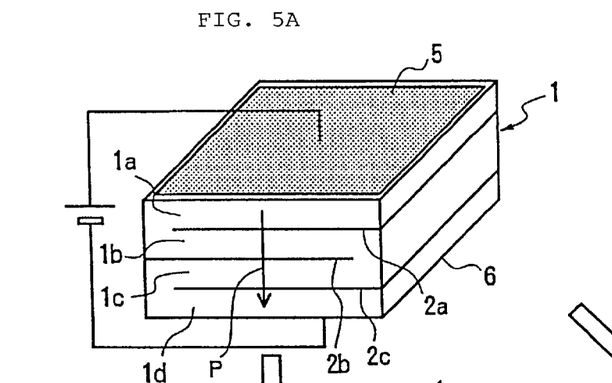
FIGS. 5A, 5B, 5B', 5C, and 5D are flow diagrams showing the methods of polarizing a piezoelectric body according to the first and second preferred embodiments of the present invention.
Figure 5B:
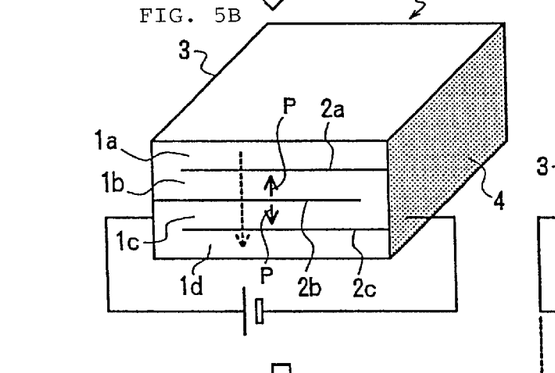
Figure 5C:
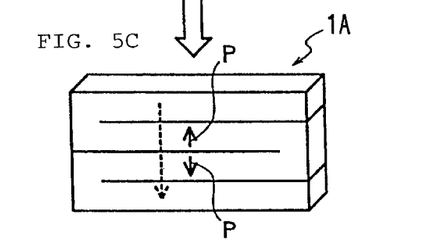

FIGS. 5A, 5B, 5C, 5C', and 5D illustrate first and second preferred embodiments of a method of producing a piezoelectric resonator using the method of the present invention. In a first preferred embodiment, the treatment is carried out in the order of FIG. 5A to 5B to 5C to 5D. In a second preferred embodiment, the treatment carried out in the order of FIG. 5A to 5B' to 5D. Here, similarly to the method of FIG. 1, a piezoelectric body 1 including a block-shaped piezoelectric ceramic having a multi-layer structure is used. Although a four-layer structure is shown in FIG. 5, the piezoelectric body 1 may have a structure which includes 5 layers or more.

Initially, the first preferred embodiment will be described.

As seen in FIG. 5A, electrodes 5 and 6 are provided on the top and bottom surfaces of a piezoelectric body 1, respectively. A direct current electric field (e.g., 1 to 3 kV/mm, in silicone oil at 60° C.) is applied between the electrodes 5 and 6 for a predetermined time (e.g., 5 to 30 minutes). After this, the piezoelectric body 1 is aged. The piezoelectric body 1 is uniformly polarized in the thickness direction as indicated by arrow P. In FIG. 5A, the top surface electrode 5 is on the plus side, while the bottom surface electrode 6 is on the minus side. The electrodes may be connected reversely of the above-mentioned connection direction.

Subsequently, as seen in FIG. 5B, external electrodes 3 and 4 are provided on the opposite side surfaces of the piezoelectric body 1 so as to be connected alternately to the internal electrodes 2a to 2c, respectively. A predetermined electric field is applied between the external electrodes 3 and 4 for a short period of time, and thereafter, the piezoelectric body 1 is aged. Preferably, the aging is carried out at a higher temperature than that of FIG. 5A. In FIG. 5B, the external electrode 3 electrically connected to the internal electrode 2b is positive, while the external electrode 4 electrically connected to the internal electrodes 2a and 2c is negative. However, the connection direction may be reversed.

When an electric field is applied in the direction indicated in FIG. 5B, the polarization degree of the piezoelectric layer 1c remains substantially unchanged, since the piezoelectric layer 1c is polarized in the same direction as that of FIG. 5A. On the other hand, the piezoelectric layer 1b is polarized in the reverse direction with respect to that of FIG. 5A, so that polarization-inversion occurs. The non-uniformity of the polarization degree distribution is significantly reduced at polarization inversion, so that the amount of scatter in polarization degrees within the piezoelectric body 1 is greatly reduced, as shown in FIG. 3. Regarding the piezoelectric layers 1a and 1d on the outer surfaces, the polarization axis shown in FIG. 5A remains unchanged as indicated by the broken line arrow.

Subsequently, the piezoelectric body 1 is cut substantially perpendicularly relative to the internal electrodes 2a to 2c into substantially rectangular elements, whereby a substantially rectangular element 1A is obtained. Since the amount of scatter in polarization degrees within the piezoelectric block is greatly reduced by the polarization-inversion of FIG. 5B, the amounts of scatter in polarization degrees within each substantially rectangular element and between substantially rectangular elements are substantially decreased.

Figure 5D:
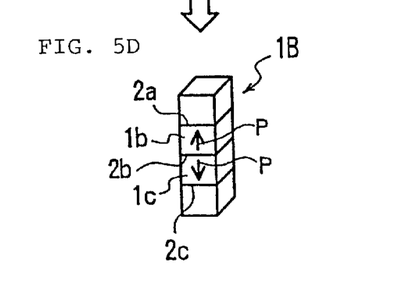

Finally, the substantially rectangular element 1A is cut substantially perpendicularly relative to the internal electrodes 2a to 2c into a shape as shown in FIG. 5D.

Thus, a device 1B is obtained in which the piezoelectric layers 1b and 1c on both sides of the internal electrode 2b are polarized in the opposite directions to each other. Since the amounts of scatter in polarization degrees within each substantially rectangular element and between the substantially rectangular elements are greatly reduced, the amount of scatter in polarization degrees between the devices 1B, produced by cutting the substantially rectangular element 1A is minimal. The internal electrodes 2a to 2c of the device 1B are alternately led out from the opposite side surfaces thereof, or the internal electrodes 2a to 2c are alternately led out from one side surface thereof, whereby a monolithic piezoelectric resonator described in Japanese Unexamined Patent Application Publication No. 10-43330 is obtained.

Next, the second preferred embodiment of the present invention will be described.

The polarization treatment of FIG. 5A is preferably the same as that of the first example.

Subsequently, as shown in FIG. 5B', the piezoelectric body 1 is cut substantially perpendicularly relative to the internal electrodes 2a to 2c into substantially rectangular elements. External electrodes 3 and 4 are provided on the opposite side surfaces of the substantially rectangular element 1A so as to be connected alternately to the internal electrodes 2a to 2c. A direct current electric field is applied between the external electrodes 3 and 4 for a desired time (e.g., 1 to 200 seconds), and thereafter, the substantially rectangular element 1A is aged. Desirably, the aging is carried out at a higher temperature than that of FIG. 5A. The above-described substantially rectangular element 1A may be produced by forming the external electrodes 3 and 4 on the piezoelectric body 1 previously, and cutting the body into substantially rectangular elements.

In FIG. 5B', the external electrode 3 connected to the internal electrode 2b is positive, while the external electrode 4 connected to the internal electrodes 2a and 2c is negative. However, the connection direction of the external electrodes 3 and 4 may be reversed. When an electric field is applied as shown in FIG. 5B', the polarization degree of the piezoelectric layer 1c remains substantially unchanged, since the piezoelectric layer 1c is polarized in the same direction as that of FIG. 5A. On the other hand, the piezoelectric layer 1b is polarized in the reverse direction with respect to that of FIG. 5A, so that the polarization inversion occurs. Thus, the non-uniformity of the polarization degree distribution within the substantially rectangular element is greatly reduced.

Regarding the polarization treatment of FIG. 5B', it is not necessary to polarize all of the substantially rectangular elements 1A produced by cutting one piezoelectric body 1 with the same electric field for the same amount of time. That is, since the polarization degrees in the end portions of the piezoelectric body 1 are increased as compared with that in the center thereof, as seen in FIG. 3, preferably, a higher electric field is applied for a longer period of time to the substantially rectangular elements 1A produced by cutting the end portions of the piezoelectric body 1 for polarization-inversion, as compared with substantially rectangular elements 1A produced by cutting the central portion of the piezoelectric body 1. Thus, by individually adjusting the polarization degrees of the substantially rectangular elements 1A, the amount of scatter in polarization degrees between the substantially rectangular elements 1A is substantially reduced.

The substantially rectangular element 1A obtained as described above is cut into a device shape as shown in FIG. 5D to produce a device 1B. The device 1B formed in the second preferred embodiment has a further reduced amount of scatter in polarization degrees between the devices 1B as compared with the device 1B formed in the first preferred embodiment. Thus, a piezoelectric resonator having uniform characteristics is provided.

After the polarization inversion is carried out in the state of a substantially rectangular element as shown in FIG. 5B', a low electric field may be applied in the backward and forward directions to finely adjust the polarization degree, before the substantially rectangular element is cut into the device shape, as shown in FIG. 5D. By this, the amount of scatter in polarization degrees, caused by the different cutting positions in the piezoelectric body 1, that is, the amount of scatter in polarization degrees between substantially rectangular elements is even more reduced.

Also, regarding the substantially rectangular element 1A shown in FIG. 5C, an electric field may be applied in the backward or forward direction for fine adjustment of the polarization degree, as shown by the broken line in FIG. 5B', before the external electrodes 3 and 4 are removed.

TABLE 1 lists the amounts of scatter in polarization degrees within each substantially rectangular element, between the substantially rectangular elements, and within each piezoelectric block, obtained by the conventional method (see FIG. 1) and in the first and second preferred embodiments. The amounts of scatter in polarization degrees were measured at the step where each substantially rectangular element was divided into the devices. Further, the polarization degree is defined as a difference (df) between the resonance frequency and the anti-resonance frequency. Here, the target polarization degree of the device is set at 55 kHz.

TABLE 1

|  | conventional | first example | second example |
|---|---|---|---|
| df distribution within substantially rectangular element average | 4.23 | 2.4 | 1.85 |
| df distribution between substantially rectangular elements |  |  |  |
| center polarization degree | 57.92 | 58.57 | 55.35 |
| 3σ | 5.16 | 2.64 | 0.99 |
| r | 5.24 | 2.6 | 1.05 |
| df distribution within whole block |  |  |  |
| center polarization degree | 57.92 | 58.57 | 55.35 |
| 3σ | 6.15 | 3.27 | 1.68 |
| r | 8.52 | 5.53 | 3.93 |

As seen in TABLE 1, the amounts of scatter in polarization degrees within each substantially rectangular element is 4.23 kHz for the conventional method, and are reduced to 2.4 kHz and 1.85 kHz for the first and second preferred embodiments, respectively. That is, the amounts of scatter are reduced to about half the value of the conventional method. Further, the amounts of scatter in polarization degrees between the substantially rectangular elements is 5.24 kHz for the conventional method, and are considerably reduced to 2.6 kHz and 1.05 kHz for the first and second preferred embodiments, respectively. The amounts of scatter within each of the whole blocks are 8.52 kHz for the conventional method, and are reduced to 5.53 kHz and 3.93 kHz for the first and second preferred embodiments, respectively. Further, for the first preferred embodiment, the value of 3σ representing a concentration degree with respect to the center polarization degree is reduced to about half the value of the conventional method. Further, for the second preferred embodiment, the value of 3σ is reduced to about one quarter that of the conventional method. The reduction of the amount of scatter within each substantially rectangular element is due to effects of the polarization inversion, while the reduction of the amount of scatter during the substantially rectangular elements is effected by the individual adjustment of the substantially rectangular elements.

In the above-described results, it is seen that the use range (yield) of the piezoelectric body is greatly improved.

FIGS. 6A, 6B, 6C, 6C7, 6D, and 6E illustrate third and fourth preferred embodiments of a method of producing a piezoelectric resonator using the method of the present invention. In the third preferred embodiment, the treatment is carried out in the order of FIG. 6A to 6B to 6C to 6D to 6E. In the fourth preferred embodiment, the treatment is conducted in the order of FIG. 6A to 6B to 6C' to 6E.

Initially, the third preferred embodiment will be described.

Figure 6A:
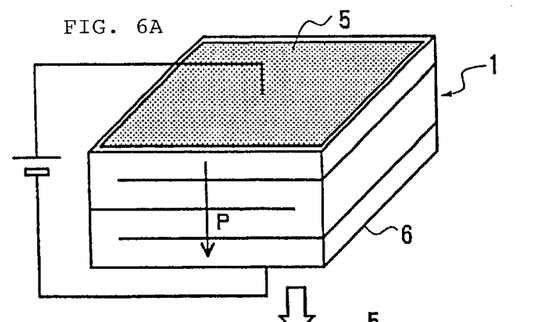
FIG. 6A, 6B, 6C, 6C', 6D, and 6E are flow diagrams showing the methods of polarizing a piezoelectric body according to the third and fourth preferred embodiments of the present invention.

As seen in FIG. 6A, electrodes 5 and 6 are provided on the top and bottom surfaces of a piezoelectric body 1, respectively. A direct current electric field (e.g., 1 to 3 kV/mm, in silicone oil at 60° C.) is applied between the electrodes 5 and 6 for a desired amount of time (e.g., 5 to 30 minutes). By this, the piezoelectric body 1 is uniformly polarized in the thickness direction as indicated by arrow P.

Figure 6B:
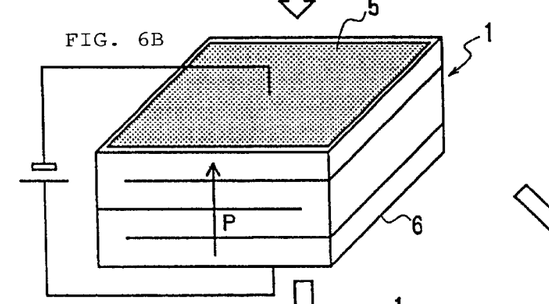

Subsequently, a direct current electric field (e.g., 1 to 3 kV/mm, in silicone oil at 60° C.) is applied reversely of the direction indicated in FIG. 6A, for a desired amount of time (e.g., 5 to 30 minutes). After this, the piezoelectric body 1 is aged. Thus, the piezoelectric body 1 is polarization-inverted uniformly in the thickness direction. The non-uniformity of the polarization degree distribution in the piezoelectric body 1 is reduced by the polarization inversion.

Figure 6C:
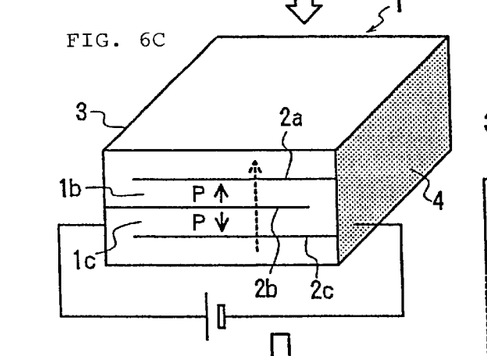

Subsequently, as seen in FIG. 6C, external electrodes 3 and 4 are arranged on the opposite side surfaces of the piezoelectric body 1 so as to be alternately connected to the internal electrodes 2a to 2c. A desired electric field is applied between the external electrodes 3 and 4 for a short time, and thereafter, the piezoelectric body 1 is aged. Preferably, the aging is carried out at a higher temperature than that of FIG. 6B.

By applying the electric field in the direction indicated in FIG. 6C, the polarization degree of the piezoelectric layer 1b remains substantially unchanged, since the piezoelectric layer 1b is polarized in the same direction as that of FIG. 6B. On the other hand, the polarization-inversion occurs again in the piezoelectric layer 1c, since the piezoelectric layer 1c is polarized reversely relative to the direction of FIG. 6B. That is, the piezoelectric layer 1b is polarization-inverted one time in the step of FIG. 6B, while the piezoelectric layer 1c is polarization-inverted two times in the steps of FIGS. 6B and 6C. Thus, the second polarization-inversion is easily performed.

Figure 6D:
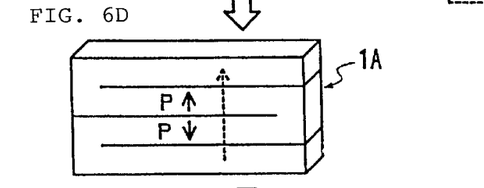
Figure 6E:
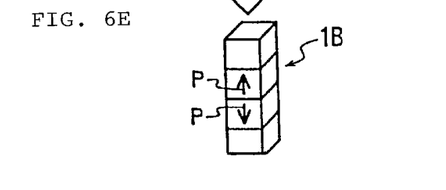

The succeeding treatment is similar to that of FIGS. 5C and 5D. That is, as shown in FIG. 6D, the piezoelectric body 1 is cut substantially perpendicularly relative to the internal electrodes 2a to 2c into substantially rectangular. elements, whereby a substantially rectangular element A is obtained. After this, the substantially rectangular element 1A is cut into a device shape as shown in FIG. 6E to obtain a device 1B.

Next, the fourth preferred embodiment will be described.

The polarization treatment illustrated in FIGS. 6A and 6B is preferably the same as that in the third preferred embodiment.

Subsequently, as shown in FIG. 6C', the piezoelectric body 1 is cut substantially perpendicularly relative to the internal electrodes 2a to 2c into substantially rectangular elements. External electrodes 3 and 4 are arranged on the opposite side surfaces of the substantially rectangular element A so as to be connected alternately to the internal electrodes 2a to 2c. A direct current electric field is applied between the external electrodes 3 and 4 for a desired amount of time (e.g., 1 to 200 seconds), and is aged. Preferably, the aging is carried out at a higher temperature than that of FIG. 6B. The above-described substantially rectangular element 1A may be produced by previously providing external electrodes 3 and 4 on the piezoelectric body 1, and cutting the body having the electrodes into substantially rectangular elements.

When the electric field is applied in the direction shown in FIG. 6C', the polarization degree of the piezoelectric layer 1b remains substantially unchanged, since the piezoelectric layer 1b is polarized in the same direction as that indicated in FIG. 6B. On the other hand, the polarization-inversion occurs again in the piezoelectric layer 1c, since the piezoelectric layer 1c is polarized reversely relative to the direction of FIG. 6B. That is, the polarization layer 1b is polarization-inverted one time in the step of FIG. 6B, while the piezoelectric layer 1c is polarization-inverted two times in the steps of FIGS. 6B and 6C'. Thus, the second polarization-inversion in the substantially rectangular element is easily performed.

With respect to the polarization treatment of FIG. 6C', it is not necessary to polarize all the substantially rectangular elements 1A formed by cutting one piezoelectric body 1 by applying the same electric field for the same time. That is, the polarization degrees in the end portions of the piezoelectric body 1 are increased as compared with that in the center thereof. Hence, the substantially rectangular elements 1A produced by cutting the end portions are polarization-inverted by applying a higher electric field for a longer period of time as compared with the substantially rectangular elements 1A formed by cutting the center portion, if necessary. By this, the amount of scatter in polarization degrees between the substantially rectangular elements is greatly reduced.

The substantially rectangular element 1A formed as described above is cut in a device shape shown in FIG. 6E to obtain a device 1B. For the device 1B formed in the fourth preferred embodiment, the amount of scatter in polarization degrees between the devices is further reduced as compared to the device 1B obtained in the third preferred embodiment. Thus, a piezoelectric resonator having uniform characteristics is provided.

The polarization degree may be finely adjusted by applying an electric field in the backward, forward directions indicated by the broken line in FIG. 6E, after the polarization-inversion is carried out in the substantially rectangular element state as shown in FIG. 6C', before the substantially rectangular element is cut into the device shape shown in FIG. 6E. By this, the amount of scatter in polarization degrees between the substantially rectangular elements is further reduced.

Moreover, for the substantially rectangular element 1A shown in FIG. 6D, the polarization degree may be finely adjusted by applying to the substantially rectangular element 1A a low electric field in the backward or forward direction as indicated by the broken line of FIG. 6C' before the external electrodes 3 and 4 are removed.

TABLE 2 lists the amounts of scatter in polarization degrees within each substantially rectangular element, during the substantially rectangular elements, and within each piezoelectric block, obtained by the conventional method (see FIG. 1), and in the third and fourth preferred embodiments. The conditions of the measurement method are the same as those of TABLE 1.

TABLE 2

|  | conventional | third example | forth example |
|---|---|---|---|
| df distribution within substantially rectangular element average | 4.23 | 2.2 | 2.12 |

TABLE 2-continued

|  | conventional | third example | forth example |
|---|---|---|---|
| df distribution between substantially rectangular elements |  |  |  |
| center polarization degree | 57.92 | 55.8 | 56.19 |
| 3σ | 5.16 | 2.7 | 1.8 |
| r | 5.24 | 2.7 | 2.45 |
| df distribution within block |  |  |  |
| center polarization degree | 57.92 | 55.8 | 56.19 |
| 3σ | 6.15 | 2.22 | 2.52 |
| r | 8.52 | 5.64 | 4.48 |

As seen in TABLE 2, the amounts of scatter in polarization degrees within each substantially rectangular element are 4.23 kHz for the conventional method, and are reduced to 2.2 kHz and 2.12 kHz for the third and fourth preferred embodiments, respectively. Further, the amounts of scatter in polarization degrees between the substantially rectangular elements are 5.24 kHz for the conventional method, and are reduced to 2.7 kHz and 2.45 kHz for the third and fourth preferred embodiments, respectively. Still further, the amounts of scatter in polarization degrees within each of the whole blocks are 8.52 kHz for the conventional method, and are reduced to 5.64 kHz and 4.48 kHz for the third and fourth preferred embodiments.

In the above-described results, it is seen that the use range (yield) of the piezoelectric body is greatly improved.

Figure 7A:
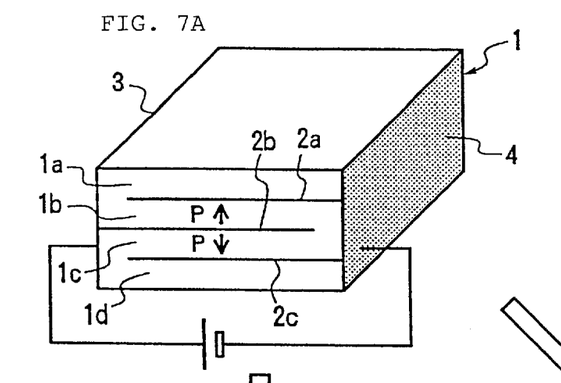
FIG. 7A, 7B, 7B', 7C, and 7D are flow diagrams showing the methods of polarizing a piezoelectric body according to the fifth and sixth preferred embodiments of the present invention.
Figure 7B:
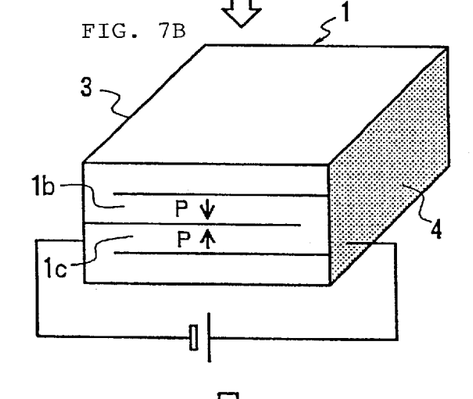

FIGS. 7A, 7B, 7B', 7C, and 7D illustrate fifth and sixth preferred embodiments of a method of producing a piezoelectric resonator using the method of the present invention. In the fifth preferred embodiment, the treatment is carried out in the order of FIG. 7A to 7B to 7C to 7D. In the sixth preferred embodiment, the treatment is conducted in the order of FIG. 7A to 7B' to 7D.

Initially, the fifth preferred embodiment will be described.

As seen in FIG. 7A, external electrodes 3 and 4 are arranged on the opposite side surfaces of a piezoelectric body 1 so as to be alternately conducted to internal electrodes 21 to 2c, respectively. A direct current electric field (e.g., 1 to 3 kV/mm, in silicone oil at 60° C.) is applied between the external electrodes 3 and 4 for a desired amount of time (e.g., 5 to 30 minutes). After this, the piezoelectric body 1 is aged. Thus, the piezoelectric layers 1b and 1c on both sides of the internal electrode 2b are polarized in the opposite directions.

Subsequently, as shown in FIG. 7B, a direct current electric field (e.g., 1 to 3 kV/mm, in silicone oil at 60° C.) is applied reversely of the direction indicated in FIG. 7A for a desired amount of time (e.g., 5 to 30 minutes). After this, the piezoelectric body 1 is aged above the aging temperature in the step of FIG. 7A. By this, the piezoelectric layers 1b and 1c are simultaneously polarization-inverted, and the non-uniformities of the polarization degree curves of the piezoelectric layers 1b and 1c are substantially reduced.

The succeeding treatment is the same as that of FIG. 5C to 5D. That is, the piezoelectric body 1 is cut into substantially rectangular elements shown in FIG. 7C to obtain a substantially rectangular element 1A. The substantially rectangular element 1A is cut into the device shape shown in FIG. 7D to obtain a device 1B.

Next, the sixth preferred embodiment will be described.

The polarization treatment illustrated in FIG. 7A is preferably the same as that of the fifth preferred embodiment.

Subsequently, as shown in FIG. 7B', the piezoelectric body 1 is cut substantially perpendicularly to the internal electrodes 2a to 2c into substantially rectangular elements. A desired electric field is applied between external electrodes 3 and 4 provided on the opposite side surfaces of the substantially rectangular element 1A, for a desired amount time (e.g., 1 to 200 seconds), and thereafter, the piezoelectric body 1 is aged. Preferably, the aging is carried out at a higher temperature than that in the step of FIG. 7A.

By applying the electric field in the direction indicated in FIG. 7B', the piezoelectric layers 1b and 1c are simultaneously polarization-inverted, so that the non-uniformities in the polarization degree distributions of the piezoelectric layers 1b and 1c are substantially reduced. That is, the amount of scatter in polarization degrees within each substantially rectangular element is greatly reduced. Regarding the polarization treatment of FIG. 7B', it is not necessary to polarize all the substantially rectangular elements 1A produced by cutting one piezoelectric body 1 by applying the same electric field for the same amount of time. Preferably, the substantially rectangular elements 1A are conditioned depending on where the substantially rectangular elements 1A have been cut in the piezoelectric body 1. More particularly, the polarization degree in the end portions of the piezoelectric body 1 is higher as compared with that in the center thereof. Accordingly, preferably, a higher electric field is applied for a longer amount of time to the substantially rectangular elements 1A produced by cutting the end portions of the piezoelectric body 1 so as to be polarization-inverted, as compared with substantially rectangular elements 1A formed by cutting the central portion of the piezoelectric body 1, if necessary. Accordingly, the amount of scatter in polarization degrees between the substantially rectangular elements 1A is greatly reduced.

The substantially rectangular element 1A formed as described above is cut into a device shape as shown in FIG. 7D to obtain a device 1B. For the devices 1B produced in the sixth preferred embodiment, the amount of scatter in polarization degrees between the devices is lower as compared with that of the devices 1B produced in the fifth preferred embodiment. Thus, a piezoelectric resonator having uniform characteristics is provided.

Figure 7C:
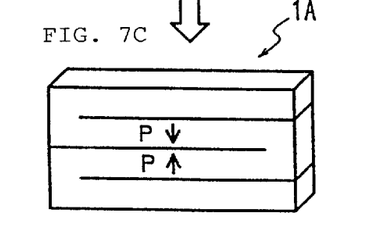
Figure 7D:
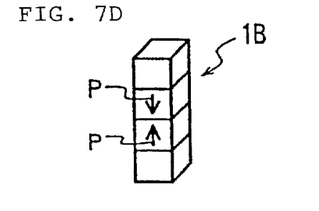

After the polarization-inversion is carried out in the substantially rectangular element state as shown in FIG. 7B', the polarization degree of the substantially rectangular element 1A may be finely adjusted by applying a low electric field in the backward and forward directions as indicated by the broken line before the substantially rectangular element 1A is cut in the device shape shown in FIG. 7D. Accordingly, the amount of scatter in polarization degrees between the substantially rectangular elements is further reduced.

In addition, for the substantially rectangular element 1A shown in FIG. 7C, the polarization degree may be finely adjusted by applying to the substantially rectangular element 1A a low electric field in the backward or forward directions as indicated by the broken line in FIG. 7B'.

TABLE 3 lists the amounts of scatter in polarization degrees within each substantially rectangular element, between the substantially rectangular elements, and within each of the whole piezoelectric blocks, obtained by the conventional method (see FIG. 1), and in the fifth and sixth preferred embodiments. The conditions of measurement method and so forth are the same as those of TABLE 1.

TABLE 3

|  | conventional | fifth example | sixth example |
| --- | --- | --- | --- |
| df distribution within substantially rectangular element average | 4.23 | 3.37 | 2.19 |
| df distribution between substantially rectangular elements |  |  |  |
| center polarization degree | 57.92 | 54.37 | 56.44 |
| 3σ | 5.16 | 4.08 | 1.62 |
| r | 5.24 | 4.53 | 2.15 |
| df distribution within block |  |  |  |
| center polarization degree | 57.92 | 54.37 | 56.44 |
| 3σ | 6.15 | 4.86 | 2.4 |
| r | 8.52 | 7.27 | 4.59 |

As seen in TABLE 3, the amounts of scatter in polarization degrees within each substantially rectangular element are 4.23 kHz for the conventional method, and 3.37 kHz and 2.19 kHz, for the fifth and sixth preferred embodiments, respectively. Further, the amounts of scatter between the substantially rectangular elements are 5.24 kHz and 4.53 kHz and 2.15 kHz for the fifth and sixth preferred embodiments, respectively. Moreover, the amounts of scatter within each of the whole blocks are 8.52 kHz for the conventional method, and 7.27 kHz and 4.59 kHz for the fifth and sixth preferred, respectively. It is seen in the above-described results that the use range (yield) of the piezoelectric body is substantially enhanced.

The method of polarizing a piezoelectric body of the present invention is not restricted to the above-described preferred embodiments and examples.

For example, as illustrated in FIGS. 6A and 6B, the piezoelectric body in the block state is polarized in one direction, and thereafter, is polarization-inverted in the reverse direction. The polarization-inversion may be repeated several times.

Similarly, in the steps of FIG. 7A to 7B, the polarization-inversion is carried out one time. The polarization-inversion may be conducted several times.

As seen in the above description, according to the first preferred embodiment of the present invention, an electric field is applied to the piezoelectric electric body to polarize the body uniformly in the thickness direction, and thereafter, an electric field is applied in the reverse direction to the piezoelectric layers on both sides of each internal electrode, respectively, whereby only the piezoelectric layer on one side of the internal electrode is polarization-inverted. Thus, the amount of scatter in the polarization degree distribution is substantially reduced. Accordingly, by cutting the piezoelectric body for use, a piezoelectric resonator having uniform characteristics is produced, and moreover, the use range is widened, that is, the yield is greatly increased.

According to the second preferred embodiment of the present invention, the piezoelectric body is uniformly polarized in the thickness direction, and subsequently, the body is polarization-inverted for the first time. Therefore, the subsequent polarization-inversion of the piezoelectric layer on one side of each internal electrode is more easily performed as compared with that according to the first preferred embodiment of the present invention.

According to the third preferred embodiment of the present invention, the piezoelectric layers on both sides of each internal electrode are polarized in the opposite directions, and thereafter, the piezoelectric layers on both sides of the internal electrode are polarization-inverted at the same time. Accordingly, any of the piezoelectric layers is polarization-inverted, so that the amount of scatter in the polarization degree is greatly reduced.

It should be understood that the foregoing description is only illustrative of the present invention. Various alternatives and modifications can be devised by those skilled in the art without departing from the invention. Accordingly, the present invention is intended to embrace all such alternatives, modifications and variations that fall within the scope of the appended claims.

What is claimed is:

1. A method of polarizing a piezoelectric body having a plurality of piezoelectric layers and internal electrodes which are alternately laminated, the method comprising the steps of:

applying an electric field to said piezoelectric body to polarize the body uniformly in the thickness direction thereof; and applying electric fields in the opposite directions to the piezoelectric layers on both sides of each internal electrode, respectively, such that only the piezoelectric layer on one side of the internal electrode is polarization-inverted.

2. A method of polarizing a piezoelectric body according to claim 1, wherein the step of polarization-inverting only the piezoelectric layer on one side of the internal electrode is carried out on a substantially rectangular element formed by cutting the piezoelectric body substantially perpendicularly relative to the internal electrodes.

3. A method of polarizing a piezoelectric body according to claim 1, wherein the step of applying an electric field to said piezoelectric body includes providing a first electrode on a top surface of said piezoelectric body, and providing a second electrode on a bottom surface of said piezoelectric body.

4. A method of polarizing a piezoelectric body according to claim 1, wherein the step of applying electric fields in the opposite directions to the piezoelectric layers includes providing a first electrode to one side surface of said piezoelectric body, and providing a second electrode to a side surface of said piezoelectric body opposite to said one side surface.

5. A method of polarizing a piezoelectric body according to claim 1, further comprising the step of cutting the piezoelectric body substantially perpendicularly to the internal electrodes after the polarization-inversion is carried out.

6. A method of polarizing a piezoelectric body having a plurality of piezoelectric layers and internal electrodes which are alternately laminated, the method comprising the steps of:

applying a first electric field to said piezoelectric electric body to polarize the body uniformly in the thickness direction thereof;

applying a second electric field in the reverse direction with respect to that of the first electric field, such that the piezoelectric body is uniformly polarization-inverted in the thickness direction; and applying additional electric fields in opposite directions to the piezoelectric layers on both sides of each internal electrode, respectively, such that only the piezoelectric layer on one side of the internal electrode is polarization-inverted.

7. A method of polarizing a piezoelectric body according to claim 6, wherein the step of polarization-inverting only the piezoelectric layer on one side of the internal electrode is carried out on a substantially rectangular element formed by cutting the piezoelectric body substantially perpendicularly relative to the internal electrodes.

8. A method of polarizing a piezoelectric body according to claim 6, wherein the steps of applying a first electric field to said piezoelectric body and applying a second electric field in the reverse direction include providing a first electrode on a top surface of said piezoelectric body, and providing a second electrode on a bottom surface of said piezoelectric body.

9. A method of polarizing a piezoelectric body according to claim 6, wherein the step of applying additional electric fields in the opposite directions relative to the piezoelectric layers includes providing a first electrode to one side surface of said piezoelectric body, and providing a second electrode to a side surface of said piezoelectric body opposite to said one side surface.

10. A method of polarizing a piezoelectric body according to claim 6, further comprising the step of cutting the piezoelectric body substantially perpendicularly relative to the internal electrodes after the polarization-inversion is carried out.

11. A method of polarizing a piezoelectric body having a plurality of piezoelectric layers and internal electrodes which are alternately laminated, the method comprising the steps of:

applying first electric fields in opposite directions to the piezoelectric layers on both sides of each internal electrode, respectively, such that the piezoelectric layers on both sides of the internal electrode are polarized in the opposite directions;

applying second electric fields in reverse directions with respect to the directions of the first electric fields to the piezoelectric layers on both sides of the internal electrode, respectively, such that the piezoelectric layers on both sides of the internal electrode are polarization-inverted.

12. A method of polarizing a piezoelectric body according to claim 11, wherein the step of polarization-inverting the piezoelectric layers on both sides of each internal electrode is carried out on a substantially rectangular element formed by cutting the piezoelectric body substantially perpendicularly to the internal electrodes.

13. A method of polarizing a piezoelectric body according to claim 12, wherein with respect to the polarization-inversion carried out on the substantially rectangular element, the polarization degree is adjusted corresponding to the position of the substantially rectangular element in the piezoelectric body before the piezoelectric body is cut into the substantially rectangular elements.

14. A method of polarizing a piezoelectric body according claim 13, wherein a lower electric field is applied in the forward or backward direction to the substantially rectangular element formed by cutting the piezoelectric body substantially perpendicularly relative to the internal electrodes and after the polarization-inversion, whereby the polarization degree is finely adjusted.

15. A method of polarizing a piezoelectric body according to claim 12, wherein with respect to the polarization-inversion carried out on the substantially rectangular element, the polarization degree is adjusted corresponding to the position of the substantially rectangular element in the piezoelectric body before the piezoelectric body is cut into the substantially rectangular elements.

16. A method of polarizing a piezoelectric body according claim 15, wherein a lower electric field is applied in the forward or backward direction to the substantially rectangular element formed by cutting the piezoelectric body substantially perpendicularly relative to the internal electrodes and after the polarization-inversion, whereby the polarization degree is finely adjusted.

17. A method of polarizing a piezoelectric body according to claim 11, further comprising the step of cutting the piezoelectric body substantially perpendicularly to the internal electrodes after the polarization-inversion is carried out.

18. A method of polarizing a piezoelectric body according claim 11, wherein a lower electric field is applied in the forward or backward direction to the substantially rectangular element formed by cutting the piezoelectric body substantially perpendicularly relative to the internal electrodes and after the polarization-inversion, whereby the polarization degree is finely adjusted.

19. A method of polarizing a piezoelectric body according claim 12, wherein a lower electric field is applied in the forward or backward direction to the substantially rectangular element formed by cutting the piezoelectric body substantially perpendicularly relative to the internal electrodes and after the polarization-inversion, whereby the polarization degree is finely adjusted.

20. A method of polarizing a piezoelectric body according to claim 11, wherein the steps of applying electric fields in the opposite directions to the piezoelectric layers and applying electric fields in the reverse direction include providing a first electrode to one side surface of said piezoelectric body, and providing a second electrode to a side surface of said piezoelectric body opposite to said one side surface.

* * * * *